United States Patent Office 3,455,914

Patented July 15, 1969

3,455,914

REPROGRAPHIC COPYING COMPOSITION AND REPROGRAPHIC COPYING MATERIAL PREPARED THEREWITH

Hans Ruckert, Wiesbaden-Schierstein, Germany, assignor, by mesne assignments, to Azoplate Corporation, Murray Hill, N.J., a corporation of New Jersey No Drawing. Filed Mar. 10, 1967, Ser. No. 622,032
Claims priority, application Germany, Mar. 12, 1966, K 58,703
Int. Cl. C09b *23/04, 23/14;* C07c *135/00*
U.S. Cl. 260—240 8 Claims

ABSTRACT OF THE DISCLOSURE

The present invention relates to a reprographic copying composition and a reprographic copying material prepared therewith, the copying composition containing a resin which is insoluble in water, soluble in organic solvents and soluble or swellable in alkaline aqueous solution, and a water-insoluble light-sensitive aryl azide which is homogeneously distributed in the resin. Further, the light-sensitive aryl azide simultaneously is an azido-nitrone and corresponds to the following general formula:

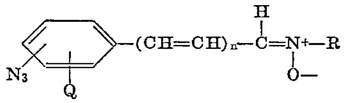

wherein Q is hydrogen or other substituent,

R is an isocyclic aromatic or a heterocyclic aromatic group, substituted or unsubstituted,

*n* is 0 or 1, and the group $N_3$ is in meta or para position to the group $$(CH=CH)_n-\overset{H}{C}=NO-R$$

Organic azido compounds, primarily aromatic azides, are among the light-sensitive compounds which are of practical interest in the graphic reproduction arts, particularly for reproduction by means of printing forms, e.g. for planographic or intaglio or relief printing. In a number of patent specifications, e.g. in German Patents Nos. 752,852, and 929,460, processes are described employing reproduction layers containing aromatic azido compounds as the light-sensitive substances, frequently in combination with synthetic or natural substances which undergo hardening under certain conditions.

In some of the known processes, the aromatic azides are employed in water-soluble form, which requires the presence of water-soluble groups in the molecule of the azido compound used. In other processes, the aromatic azides are used in organic solvent solutions. When a layer containing an aromatic azide is exposed to actinic light, the azide is converted by the action of the light. The light-conversion products are distinguished from the unexposed azido compound by a change of color and, in the presence of hardenable substances, by hardening or tanning such hardenable substances, which leads to a change in their solubility characteristics. Reproduction layers containing aromatic azido compounds are negative-working. Upon image-wise exposure under a transparent original of the layer containing the azido compound, an image is obtained in the reproduction layer, which image is produced by the light-conversion products of the azido compound and has reversed tone values with respect to the original. Many of the aromatic azido compounds suitable as light-sensitive substances for reproduction processes belong to the group of the azido styryls. It is also known, e.g. from German Patent No. 872,729, and from French Patent No. 1,418,056, to produce light-sensitive layers which, as the light-sensitive substances, contain compounds in a water-soluble form which are produced by condensation of aromatic aldehydes with aryl hydroxylamines.

The use of aromatic azido compounds as effective substances in light-sensitive reproduction layers is of particular practical interest because of the formation of colored conversion products in such areas of the reproduction layer as have been affected by light.

The light-sensitive reproduction material of the invention consists of a support suitable for reprographic purposes and, adhering thereto, a reproduction layer having the above-described composition.

Mononuclear, condensed and uncondensed polynuclear ring systems are suitable as the aromatic group represented by R in the general formula above, e.g. the benzene ring, the naphthalene ring, pyridine ring, and the 1,2,4-thiodiazol ring. Substituents represented by Q and which may be linked to R in the general formula are, for example, halogen atoms, hydroxyl, alkyl, and azido groups.

The azidonitrones corresponding to the general formula above have not been previously described in the literature. They may be prepared by analogy to known processes. They are obtained, for example, by a smooth reaction in which an aromatic hydroxylamine is reacted with an equimolar quantity of an aromatic azidoaldehyde. The production of aromatic azidoaldehydes is known and some of them are described in the literature.

For example, one mole of the azidoaldehyde to be reacted and one mole of the aromatic hydroxylamine are separately dissolved in ethanol and both solutions are mixed at normal or slightly elevated temperature. Within a few minutes, the condensation product is obtained, almost quantitatively highly pure. If required or desired, it may be recrystallized from hot ethanol.

The formulae 1 to 9 of some of the azidonitrones employed in the reproduction composition and the reproduction material of the invention are listed below, by way of example, under consecutive numbers. Insofar as their melting points or decomposition points and their absorption maxima, $\lambda_{max.}$, can not be taken from the following examples, they are listed in the following table.

| Number of the formula | Melting or decomposition point, ° C. | $\lambda_{max.}$ (nm.) |
|---|---|---|
| 5 | 67–70 | 315 |
| 8 | 190–194 | |
| 9 | 180–186 | |

Formulae

1.

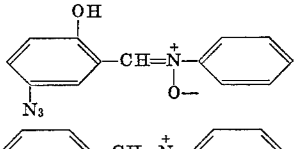

2.

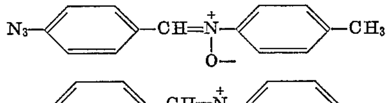

3.

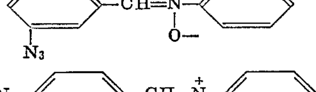

4.

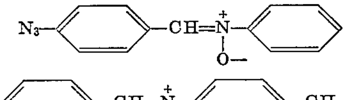

5.

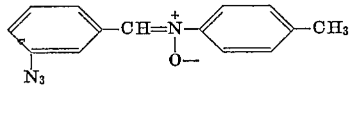

6.
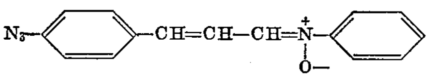

7.
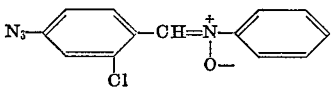

8.
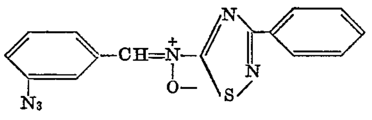

9.
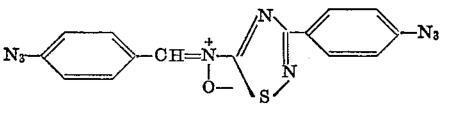

The light-sensitive reproduction compositions of the invention are prepared from one or more azidonitrones according to the general formula above, if desired with the addition of arylazides of different constitution or other negative-working light-sensitive substances, and from resins which are soluble in organic solvents and soluble or swellable in an alkaline aqueous medium. Such resins are, for example, copolymers of styrene and maleic anhydride, or of vinyl acetate and crotonic acid, polycondensates of the novolak type prepared from formaldehyde and phenols, and phenol-formaldehyde resins modified by chloroacetic acid. Generally speaking, suitable resins are soluble at 20° C., to at least 3 percent by weight thereof, in glycol monomethylether, glycol monoethylether, glycol monoethylether acetate or dimethyl formamide, and are soluble or swellable at 20° C., in a 3 percent aqueous sodium hydroxide solution, to such an extent that a dry layer of the resin adhering to a mechanically roughened aluminum support can be wiped away by swabbing with a 3 percent by weight aqueous sodium hydroxide solution.

In order to improve the film-forming capacity of the light-sensitive reproduction composition of the invention, and also the resistance thereof to etching solutions used in chemigraphy in some cases, it may be advantageous to add other resins, i.e. those which are insoluble and not swellable in aqueous alkaline solutions and which come under the designation of synthetic lacquer resins. Polyvinyl acetates, the copolymers thereof and rubber resins have proved particularly suitable therefor. In some cases, it also may be advantageous to add a plasticizer. The total quantity by weight of the resin insoluble or not swellable in aqueous alkaline solution and of plasticizer should not be more than the quantity of the resin soluble or swellable in aqueous alkaline solution.

Depending upon the desired properties of the printing form and developer to be used, the quantitative proportions of the azidonitrone, according to the general formula above, and the resins, including plasticizer, may vary within wide limits. Good results are achieved with proportions, by weight, ranging from 2:1 to 1:10, preferably from 1:1 to 1:5. Within the above limits, the proportions also are determined by the intended use of the light-sensitive reproduction material and by the properties of the developer which is employed for conversion of the reproduction material into a printing form.

For the preparation of the light-sensitive reproduction material of the invention, which comprises a conventional support suitable for reprographic purposes and a layer adhering thereto of the light-sensitive reproduction composition according to the invention, the reproduction composition is dissolved in an organic solvent and applied to the support; the applied solution then is dried. Suitable solvents for the preparation of the coating solutions are, for example, esters, such as butyl acetate; ketones, such as methylisobutyl ketone and cyclohexanone; ethers, such as diisopropyl ether and dioxane; alcohols, such as n-butanol; diolethers, such as glycol monoethylether; and acid amides, such as dimethyl formamide; and mixtures of such solvents.

The support comprises a plastic film or paper or, if desired pretreated plates or foils of the metals usually employed for printing forms, such as zinc, magnesium, aluminum, chromium, brass, and steel, as well as bimetal and trimetal foils. The support is coated with a solution of the reproduction composition of the invention by one of the customary coating techniques, e.g. by whirl-coating, spraying, immersion, roller application or by applying a film of a liquid.

The reproduction composition may be colored or the reproduction layer may be colored after application to the support and drying. In most cases, use of a colored layer is recommended mainly because it facilitates the evaluation of the development and the tone values obtained in the case of halftones. If the printing plates prepared from the reproduction material are to be etched, preferably dyestuffs are selected with which the risk of a reductive discoloration in the etching bath is small, e.g. dyestuffs of the phthalocyanine type and metal complex dyestuffs.

Processing of the reproduction material of the invention into a printing form, preferably a printing plate, is performed in a conventional manner. The material is exposed under a negative original to a light source emitting rays in the ultra-violet range of the spectrum, i.e. actinic rays. Whereas the resin component of the reproduction layer is cross-linked in the light-struck areas and thus hardened, the unexposed and soluble portions of the layer are removed by immersion and/or swabbing with an organic solvent or, preferably, with an aqueous alkaline developer. The developer also may contain salts, e.g. alkaline or alkaline earth halides, alkaline or alkaline earth phosphates, alkaline or alkaline earth silicates or alkaline or alkaline earth sulfates, quaternary ammonium bases, e.g. reaction products of amines and ethylene oxide as well as organic solvents and mixtures thereof.

In some cases, particularly for masking and correcting, it may be of advantage to render the layer more resistant by burning it in before development or before an etching process. The light-sensitive reproduction layers of the invention are distinguished in that the burning-in operation can be performed not only after exposure to light and subsequent development, but also after exposure and before development. By means of a more alkaline or more concentrated developer of the above composition, the layer is removed, after burning-in, from the areas not struck by light during exposure, whereas the light-struck areas of the layer have become more resistant to the developer as a result of the burning-in step.

Planographic printing plates produced from the light-sensitive reproduction material of the invention are inked up with greasy ink in the customary manner, after developement. When using bimetal or trimetal plates or relief or intaglio printing plates or cylinders, the layer-free areas of the printing forms are deep-etching by means of the specific etching solutions and, in the case of zinc and magnesium etching plates, in one-step etching machines by means of nitric acid with the addition of a protective medium for the side walls.

The light-sensitive reproduction composition and the light-sensitive reproduction material of the invention are distinguished by good light-sensitivity and simultaneous good stability. The shelf-life of the reproduction material of the invention is exceptional. Despite increased light-sensitivity, thermal stability is not decreased. The reproduction material has the further advantage that the image is distinctly visible immediately after exposure to light. It thus combines the qualities always required, but by no means always present, in an ideal light-sensitive reproduction material, viz. firm adhesion between the support and the light-sensitive layer, good light-sensitivity, good shelf-life, immediate visibility of the printing image after exposure to light, good affinity for greasy inks, and good mechanical resistance of the printing image and chemical resistance thereof to attack during an etching process.

In the following examples, the relation between parts by weight and parts by volume is the same as that between grams and cubic centimeters, nm. stands for nanometer, 1 nm.=1 mμ or 10 A.

Example 1

1 part by weight of the compound of Formula 3 above and 3 parts by weight of a meta cresol-formaldehyde novolak are dissolved in 100 parts by volume of glycol monoethylether. A mechanically roughened aluminum foil is whirl-coated with this solution and dried, at first by warm air and then for another 2 minutes at 100° C. The light-sensitive coated foil is exposed under a negative master to a light source emitting a large proportion of ultraviolet rays, e.g. a carbon arc lamp or a tubular exposure lamp. By wiping over the exposed layer with an approximately 15 percent aqueous solution of trisodium phosphate, the areas of the layer which were not struck by light are removed. After inking up with greasy ink, the aluminum foil then may be used for printing as a planographic printing plate.

The compound of Formula 3 is prepared from phenyl hydroxylamine and 3-azido-benzaldehyde, which is easily obtained from 3-amino-benzaldehyde by diazotization and reaction with sodium azide. The melting point of the compound is 88 to 89° C. and its absorption maximum, $\lambda_{max.}$, is 325 nm.

Example 2

2 parts by weight of the compound of Formula 4 above and 1 part by weight of meta cresol-formaldehyde novolak are dissolved in 100 parts by volume of glycolethylether acetate. A mechanically roughened aluminum foil is coated with this solution, as described in Example 1, and the coated layer is dried. An offset printing plate is then prepared in the manner described in Example 1. The developer used for the foil, after exposure under a master, is an aqueous solution of a quaternary ammonium base, prepared by reacting an aliphatic amine with ethylene oxide, which contains 1 part by weight of ammonium base in 30 parts by volume of water.

The compound of Formula 4 is prepared from phenylhydroxylamine and 4-azido-benzaldehyde. Its melting point is 146 to 148° C. and its absorption maximum, $\lambda_{max.}$, is 343 nm.

Example 3

1 part by weight of the compound of Formula 6 above and 1 part by weight of a condensation product of meta cresol-formaldehyde novolak and monochloroacetic acid are dissolved in 100 parts by volume of glycol monomethylether. A trimetal plate consisting of aluminum, copper, and chromium is coated with this solution and dried. For the preparation of a positive printing plate for long runs, the coated and dried plate is exposed under a positive master and developed with a 5 percent trisodium phosphate solution containing 5 percent of diethyleneglycol monoethylether. The chromium layer, bared by development in the unexposed areas, is dissolved away with one of the conventional etching solutions for use with chromium layers. The parts of the coating retained in the exposed areas of the original layer are removed with an organic solvent and the copper image areas are inked up in the usual manner by wiping over with greasy ink. The trimetal plate thus may be used for printing.

The compound of Formula 6 is prepared from 4-azidobenzaldehyde, acetaldehyde (intermediarily therefrom 4-azido-cinnamaldehyde) and phenyldroxylamine by analogy to the procedure given in Helv. Chim. Acta 37, 1892 (1954). The melting point of the compound is 155 to 156° C. and its absorption maximum, $\lambda_{max.}$, is 384 nm.

Example 4

1 part by weight of the compound of Formula 2 above, 1 part by weight of meta cresol-formaldehyde novolak, 1 part by weight of a copolymer resin of polyvinyl acetate and crotonic acid, and 0.2 part by weight of the phthalocyanine dyestuff Zapon Fast Blue HFL (Colour Index 74,350) are dissolved in 100 parts by volume of glycol methylether acetate. A cleaned zinc plate is coated with this solution and dried. The coated zinc plate is exposed under a master and after removal of the unexposed parts of the layer with a solution consisting of 80 percent of a 10 percent trisodium phosphate solution and 20 percent of glycol monomethylether, an image is obtained which may be processed into a relief printing plate by etching with nitric acid or, preferably, by etching in a one-step etching machine with the addition of a protective medium for the side walls. In order to improve the adhesion of the layer during the one-step etching process and during after-etching by hand for correcting the tone values, the plate may be burned-in at temperatures from 100 to 200° C., after development and before etching.

The compound of Formula 2 is prepared by condensing 4-azidobenzaldehyde and p-tolylhydroxylamine. Its melting point is 65 to 66° C. and its absorption maximum, $\lambda_{max.}$, is 310 nm.

Example 5

2 parts by weight of the compound of Formula 4 above, 2 parts by weight of meta cresol-formaldehyde novolak, 2 parts by weight of the resin obtained by condensing the above novolak and monochloroacetic acid, 2 parts by weight of polyvinyl acetate resin, and 0.5 part by weight of Zapon Fast Violet BE (Colour Index 12,196) are dissolved in 100 parts by volume of glycol monoethylether. A zinc plate is coated with this solution and dried. The light-sensitive zinc plate is processed into a zinc block in the manner described in Example 4.

After exposure and before development, the plate may be burned in for 10 minutes at 180° C. and then treated with a 2 percent aqueous sodium hydroxide solution containing 20 percent by volume of ethylene glycol monoethylether.

The preparation of the compound of Formula 4 is described in Example 2.

Example 6

1 part by weight of the compound of Formula 1 above, 1 part by weight of meta cresol-formaldehyde novolak, 1 part by weight of a copolymer of styrene and maleic anhydride, and 0.1 part by weight of a dyestuff, e.g. methyl violet, are dissolved in 100 parts by volume of a mixture consisting of glycol monomethylether and butylacetate. A support, which consists of a plastic plate or film having a copper skin, is coated with this solution and the solution applied to the copper skin is then dried. The dry layer is exposed under a negative master of a circuit and the unexposed areas of the layer are removed from the support by wiping over with an approximately 15 percent trisodium phosphate solution. The bared copper is etched with a solution of iron-III-chloride or ammonium persulfate and a so-called reproduced circuit is obtained.

The compound of Formula 1 is prepared by condensing phenylhydroxylamine and 5-azidosalicylaldehyde (melting point 90 to 91° C.), which latter is prepared via the amino compound obtained from salicylaldehyde and diazosulfanilic acid by reductive splitting of the azo dyestuff and conversion into the corresponding azido compound by diazotization and subsequent reaction with sodium azide.

The melting point of the compound of Formula 1 is 163 to 164° C. and its absorption maximum, $\lambda_{max.}$, is 380 nm.

Example 7

1 part by weight of the compound of Formula 4 above, 1 part by weight of a condensation product of meta cresol-formaldehyde novolak and monochloroacetic acid, 1 part by weight of a copolymer of styrene and maleic anhydride, and 0.2 part by weight of a dyestuff, e.g. Sudan Red, are dissolved in 100 parts by volume of glycol monoethylether. A copper plate or a copper cylinder is coated with this solution and then dried.

The light-sensitive coated support is exposed under a screen positive and developed with a solvent mixture consisting of 95 percent of glycol and 5 percent of diglycol monoethylether. The bared areas of the copper support may be deep-etched with $FeCl_3$ solution in the usual manner. A printing plate for halftone intaglio printing is thus obtained.

Example 8

1 part by weight of a mixture of the compounds of Formulae 4 and 6 above, 2 parts by weight of a copolymer of styrene and maleic anhydride, and 1 part by weight of a condensation product of meta cresolformaldehyde novolak and monochloroacetic acid are dissolved in 100 parts by volume of dimethyl formamide. A thoroughly cleaned glass plate is coated with this solution and the coated layer is dried. The dried layer is exposed under a positive master and developed with a solvent mixture consisting of 85 percent of glycol and 15 percent of triglycol.

In the areas which were not struck by light, the layer is removed from the glass support. The bared areas of the glass support, i.e. the areas corresponding to the image areas of the positive master, are deep-etched by means of an aqueous solution of hydrofluoric acid and then may be inked up after the etching process.

Example 9

A cleaned plate of refined steel is coated with the light-sensitive solution described in Example 3, which contains the compound of Formula 6 above, and resin. The coated layer is then dried. After drying, the plate is exposed under a positive master having writing thereon and developed with the developer employed in Example 3. In a bath containing an acid solution of salts or dilute acids as the electrolyte, the image of the writing is deep-etched by means of direct current (anodically) or electrochemically by means of alternating current. Graphic intelligence may be permanently fixed by this method instead of engraving or embossing.

Example 10

1 part by weight of the compound of Formula 7 above, 1 part by weight of meta cresol-formaldehyde novolak, 1 part by weight of a copolymer of styrene and maleic anhydride, 1 part by weight of a polyvinyl acetate resin, and 0.1 part by weight of methyl violet are dissolved in 100 parts by volume of glycol monomethylether. A zinc plate is coated with this solution and the coated solution is dried. The sensitized zinc plate is processed into a zinc block in the manner described in Example 4.

The compound of Formula 7 is prepared from phenylhydroxylamine and 2-chloro-4-azidobenzaldehyde (melting point 53 to 54° C.), which latter is obtained by diazotization and subsequent reaction with sodium azide of 2-chloro-4-aminobenzaldehyde, prepared from 2-chloro-4-nitrotoluene. The melting point of the compound is 108 to 110° C. and its absorption maximum, $\lambda_{max.}$, is 343 nm.

It will be obvious to those skilled in the art that many modifications may be made within the scope of the present invention without departing from the spirit thereof, and the invention includes all such modifications.

What is claimed is:

1. An azidonitrone having the formula

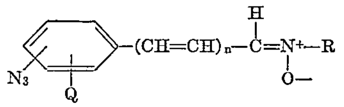

in which Q is selected from the group consisting of hydrogen, halogen, hydroxyl, alkyl, and azido groups; R is selected from the group consisting of phenyl and tolyl groups; $n$ is 0 or 1; and $N_3$ is in meta or para position to the

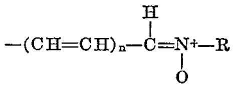

group.

2. An azidonitrone having the formula

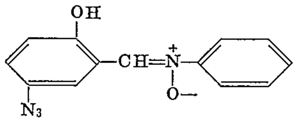

3. An azidonitrone having the formula

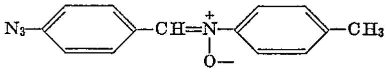

4. An azidonitrone having the formula

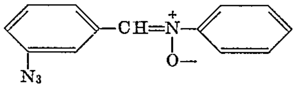

5. An azidonitrone having the formula

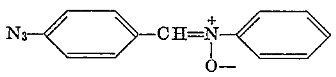

6. An azidonitrone having the formula

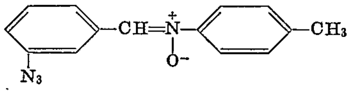

7. An azidonitrone having the formula

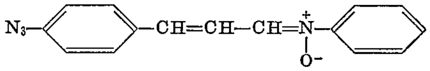

8. An azidonitrone having the formula

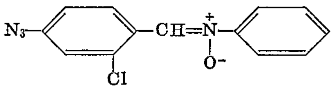

References Cited

Krbechek et al.: J. Organic Chemistry, vol. 29, pp. 1150 to 1152 (1964).
Boulton et al.: J. Chem. Soc., B 1966, pp. 1011 to 1015.

JOHN D. RANDOLPH, Primary Examiner

U.S. Cl. X.R.

96—33, 36, 91; 117—127; 260—349